INVERSE PARALLEL AMPLIFIER NETWORK
Original Filed Aug. 9, 1954
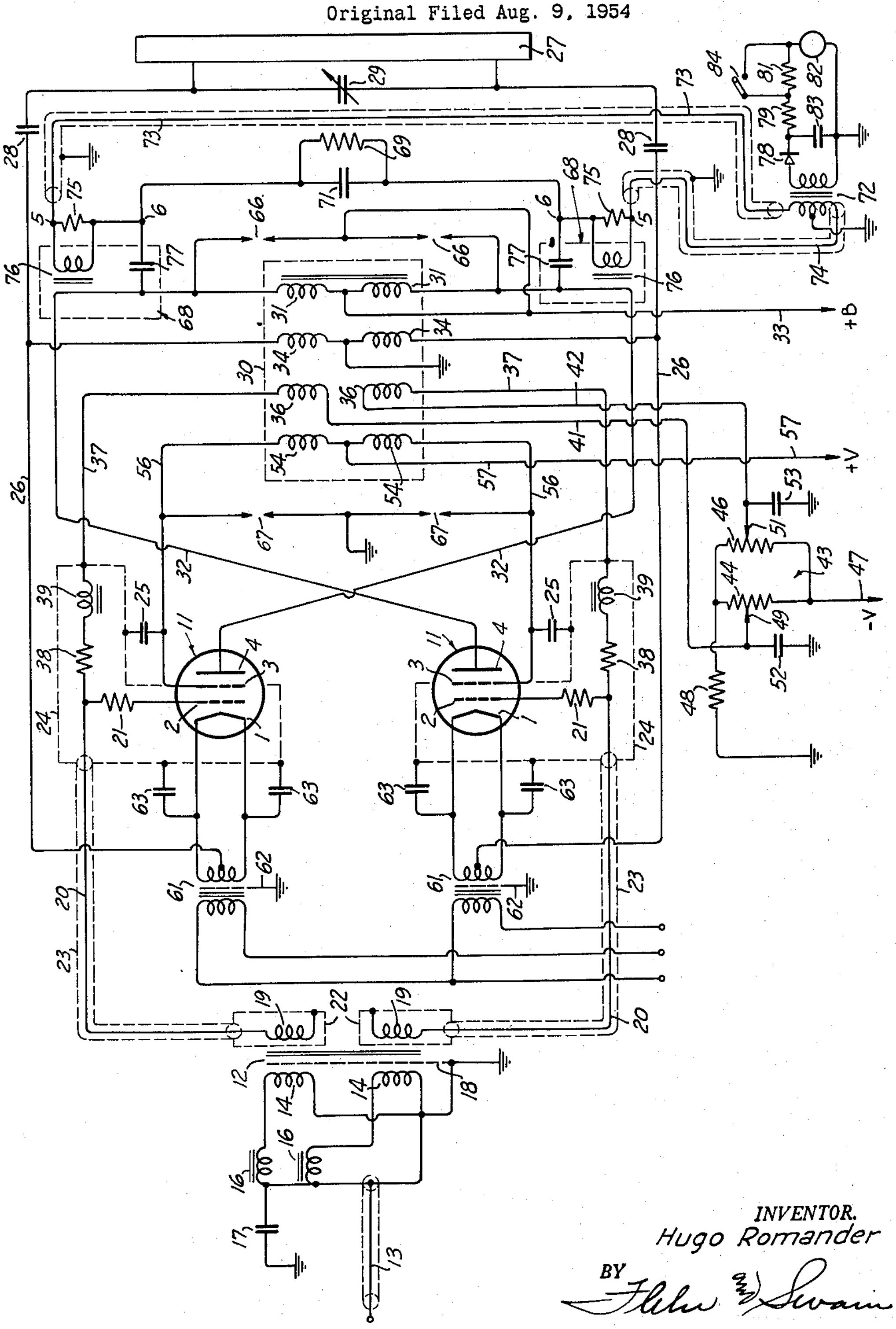
INVENTOR.
Hugo Romander
BY [signature]
ATTORNEYS United States Patent Office 2,901,562

Patented Aug. 25, 1959

2,901,562

INVERSE PARALLEL AMPLIFIER NETWORK

Hugo Romander, Redwood City, Calif., assignor, by mesne assignments, to Philco Corporation, Philadelphia, Pa., a corporation of Pennsylvania Continuation of application Serial No. 448,474, August 9, 1954. This application July 31, 1957, Serial No. 676,464

10 Claims. (Cl. 179—171)

This invention relates generally to electronic amplifier networks such as are suitable for use with communication transmitters.

This application is a continuation of my copending application Serial No. 448,474, filed August 9, 1954, for Electronic Amplifier now abandoned.

In general it is an object of the present invention to provide an improved electronic power amplifier capable of efficient operation on a selected frequency within a relatively wide frequency range, and which is characterized by a high degree of stability and absence of undesired harmonics.

Another object of the invention is to provide an electronic amplifier of the above type which is relatively free of stray feedback effects.

Another object of the invention is to provide an electronic amplifier suitable for use over a frequency range of the order of from 30 to 600 kilocycles, and which can operate at any selected frequency within such range without adjustment of any of its component elements.

Additional objects and features of the invention will appear from the following description in which the preferred embodiment has been set forth in detail in conjunction with the accompanying drawing.

The amplifier illustrated in the drawing employs a pair of tubes 11 which may, for example, be of the type known by manufacturer's specifications as No. 4–1000A. The elements of each tube include the cathode 1, control grid 2, screen grid 3, and plate 4. This pair of tubes is connected in a circuit of the inverse-parallel type.

The control grids 2 of both tubes are coupled to an input circuit including the transformer 12. The conductor lead 13, which preferably is shielded, applies input voltages to the transformer primary. In the particular arrangement shown one side of each of the two primary coils 14 is connected to ground, and the other terminal of each coil is connected to the input lead 13, through the impedance matching inductances 16. A small impedance matching capacitor 17 connects between conductor 13 and ground. Capacitor 17 can be of such value as to bypass alternating components to ground which are of a frequency substantially higher than the upper limit of the frequency range to be handled by the amplifier. A grounded electrostatic shield 18 is shown positioned adjacent to the primary coils 14 in such manner as to provide shielding from the ferrous magnetic core of the transformer and from the electrostatic shields 22 which are at radio frequency potential to ground.

One terminal of each of the secondary transformer coils 19 is connected to its corresponding control grid 2, through a resistor 21. These resistors serve as oscillation suppression or damping means to prevent oscillation due to self-excitation. Preferably series-connected resistor 38 and inductance 39 are shunted across windings 19 to serve as input impedance equalizing means by counteracting the effects of the distributed capacitance of the windings 19, the leads 20 and the capacitance of grids 2 to screen and filaments of tube 11.

The other terminal of each coil 19 is connected to the metal electrostatic shielding 22, which completely surrounds the corresponding coil, and which connects with the metal shielding 23 for the conductor 20. The shielding 23 also connects with a shielding 24, which surrounds certain of the electrical components and certain of the elements of tube 11, as will be presently explained. The shielding 22—23—24 is maintained at the signal or A.C. potential of cathode 1 by capacitors 63 which connect shielding 24 to the cathodes 1. The screen grids 3 are connected to the shielding 24 by capacitors 25. Thus each screen grid 3 is effectively at the same A.C. potential as the corresponding cathode 1.

In an inverse-parallel circuit the anode load impedance of one half of the circuit is closely coupled to the cathode load impedance of the other half of the circuit. A special multi-coil transformer 30 is included in the circuits associated with the tubes 11 to provide this connection. Thus remote terminals of the coils 31, forming one set of windings, are cross-connected by conductors 32 to the plates of the tubes 11. The other (adjacent) terminals of the coils 31 are connected together and to a lead 33, which connects with a suitable source of plate voltage (+B).

The transformer coils 34 each have remote terminals connected to the cathodes of tubes 11 via the secondaries of cathode heating transformers 61. The other terminals of these coils are shown connected together and to ground.

Additional transformer coils 36 each have one terminal connected by lead 37 to the corresponding shielding 24. The other terminals of the coils 36 are connected by leads 41 and 42 to the means 43 for applying a predetermined negative bias to the control grids. The means 43 can consist of the potentiometers 44 and 46, having their terminals connected in parallel. Lead 47 connects one terminal of each potentiometer to the negative side of a grounded source of biasing voltage, and the other terminal of each potentiometer is connected to ground through the series resistor 48. The adjustable taps or contacts 49 and 51 of the potentiometers are connected respectively to leads 41 and 42. Also these taps and the leads 41 and 42, are connected to ground through the bypass capacitors 52 and 53.

The transformer coils 54 each have one terminal connected by a lead 56 to the screen grid 3 of the corresponding vacuum tube. The other terminal of each coil 54 connects with the lead 57, which in turn is connected to a source of direct screen voltage (+V) suitable for the type of vacuum tubes being used.

The filamentary cathodes of the two tubes are connected to the secondaries of the current supply transformers 61. The primaries of these transformers are connected to suitable alternating current supply lines. The secondaries are electrostatically shielded from the primaries and the magnetic cores of the transformers, as by means of the grounded metal shielding 62.

The two output leads 26 for the amplifier are coupled to the load 27 through the coupling capacitors 28. In a typical instance, the load consists of a suitable pi filter which is tuned to the desired frequency of operation, and which supplies signal energy to a second amplifier, or to an antenna or like utilization circuit. The variable capacitor 29 may be one of the component elements of the filter. These output leads 26 are connected to the cathodes 1 of the two tubes 11 by way of the secondaries of transformers 61. Connection of leads 26 to the secondaries of transformer 61 is electrically equivalent to connecting the leads to the center of filamentary cathodes 1. Obviously tubes having indirectly heated cathodes may be substituted for the filamentary cathode types shown. The leads 26 may be returned directly to the indirectly heated cathodes in accordance with conventional practice.

The previously mentioned metal shielding 24 surrounds the resistors 21, and also the resistors 38 and the coils 39. Also, as schematically illustrated, this shielding embraces and forms a shield about the terminals of the corresponding cathode 1 and control grid 2. The terminals of each cathode are shown connected to the shielding through the bypass capacitors 63. It is an important feature of the present invention that the input circuits of the two tubes 11 are totally shielded from ground.

The circuit thus far described comprises the basic circuit of the present invention. However, as a practical matter it is usually desirable to add protective circuits if the system is to operate at high power levels and/or high D.C. potential levels. A brief description of these auxiliary circuits follows.

Suitable means can be provided to protect the system against excessive voltages. Thus protective spark gaps 66 are shown connected across the coils 31. Similar spark gaps 67 are connected between the screen leads 56 and ground.

Suitable means is provided to facilitate adjustment of the output 27 whereby an instrument indicates when its impedance matches the output impedance of the amplifier. For this purpose I employ coupling devices 68, which have the individual output terminals 5 and 6. The terminals 6 are connected together by the resistor 69, which is shunted by capacitor 71. The primary of the transformer 72 has its one terminal connected by shielded lead 73 to one terminal 5 of one of the couplers. Another shielded lead 74 connects the other terminal of the transformer 72 with the terminal 5 of the other coupling device 68.

Each coupling device 68 can be formed as disclosed and claimed in copending application, Serial No. 330,808, filed January 12, 1953, now Patent No. 2,808,566. Thus a small current transformer 76 is electromagnetically associated with the plate lead 32, whereby voltage is derived proportional to the current flowing through this lead. One side of the secondary coil of the current transformer 76 connects to the terminal 5, and the other connects with resistor 69, and is coupled to the lead 32 by means of the capacitor 77. The secondary is shunted by the resistor 75. This capacitor, together with a capacitor 71 and the resistor 69, provides voltage dividing means whereby voltage is derived proportional to the voltage difference between the leads 32. A combined voltage is developed between the leads 73 and 74 which is applied to the primary of the transformer 72. The secondary of the transformer 72 is connected to a suitable rectifying and indicating means, including the rectifier 78, the series resistors 79 and 81, and the current indicating means 82, such as a microammeter. A bypass capacitor 83 connects between one terminal of the rectifier 78 and the grounded side of the transformer secondary. The resistor 81 can be shunted by a manual switch 84 for sensitivity adjustment.

As explained in said copending application, with proper selection of values for the component elements of the coupling devices 68, the derived voltages are 180-degrees out of phase when there is proper impedance matching, to provide a null indication. With the network as described a null reading is obtained when the impedance of the amplifier plate circuit is matched with the impedance of the load as it appears from the plate circuit.

Operation of my amplifying network is as follows: Input voltages, applied by way of the input lead 13, excite the primaries of the transformer 12, whereby voltages from the secondary windings 19 are applied to the leads 20. As a result voltages are applied to the control grids 2 of the tubes 11, through the resistors 21. The anode current flowing through anode windings 31 and cathode 34 cause signal voltages to appear across cathode windings 34. The signals appearing across cathode windings 34 excite load 27 through coupling capacitors 28.

The shielding 24, which is at substantially the same D.C. potential as grids 2 of tubes 11 is varying with respect to ground at the full signal potential appearing at the cathodes 1. Windings 36 in series with the D.C. bias source for grids 2 insert an equal but oppositely polarized variation in series with the bias supply lead so that substantially no signal potential appears at taps 49 and 51. Similarly winding 54 has induced thereacross an A.C. potential equal to the signal potential appearing at cathode 1. As a result, no signal potential appears across the screen grid bias source V+.

For efficient amplifying operation the impedance of the load 27 is adjusted to provide proper matching with respect to the plate circuit of the amplifier. As previously pointed out, this is done by adjusting one or more components of the load, as for example components of the filter which is employed in conjunction with the load, until a null reading is secured for the indicating meter 82.

Some of the desirable characteristics of my amplifier are as follows: The amplifier is relatively stable in its operation, having reference particularly to its freedom from self-oscillation. Stray feed-back effects such as might otherwise tend to produce oscillation, are avoided by virtue of the shielding used in conjunction with the coils 19, and with the element 21, and the cathodes and control grids of the tubes. As noted before, the novel feature of this shielding which distinguishes the circuit of the present invention from the prior art is that the input circuit is totally shielded from ground. Because the circuit is of the inverse-parallel type in which the primary coils 31 of the transformer 30 are inversely connected to the plates of the tubes 11, the operation of the amplifier is relatively unaffected by the amount of leakage reactance between the windings of the transformer. The amplifier can be operated over a relatively wide range of radio frequencies, as for example from 30 to 600 kc., without any adjustments or changes in the component elements of the circuit. The only adjustment required to operate on various frequencies is to change the frequency of excitation and tune the load impedance adjusting filter associated with the load 27 accordingly.

It will be evident that various changes can be made without departing from the invention as defined by the appended claims.

For example, although it is economically desirable to utilize the transformer coils 54 and 36 to provide paths for direct currents between points of differing radio frequency voltage, separate high frequency chokes can be used, and the corresponding secondary windings eliminated. Also it is possible to eliminate the directional coupling devices 68 and the parts associated with the same, where it is not desirable or necessary to use this arrangement. If tubes having indirectly heated cathodes are available for the power levels at which the amplifier is to operate, such tubes may be substituted for the filamentary cathode tubes 11. If indirectly heated cathodes are employed leads 26 would be connected directly to the cathodes in accordance with conventional practice.

By way of example, I have incorporated the invention in a power amplifier having a capacity of 3 kilowatts and for operation on any selected frequency from 30 to 600 kilocycles. This amplifier used tubes known by manufacturer's specifications as Nos. 4–1000A, with 5000 volts applied to the plates of the tubes, and with 1000 volts applied to the screen grids. The negative bias applied to the control grids was adjustable over a range from 90 to 135 volts. The two primary coils 14 of the input transformer 12 each consisted of 15 turns of 2/No. 27 copper wire. Secondary windings 19 of the input transformer 12 each consisted of 120 turns of No. 35 wire. These windings were physically separated and separately shielded as previously described, the shielding being connected to corresponding terminals of the coils.

The filament transformers 61 were of conventional design and supplied the required heating current to the cathodes of the tubes. The secondary windings of these transformers were insulated from primary winding and core for high radio frequency voltages and electrostatically shielded as indicated.

The various capacitors employed in the foregoing example had values as follows:

| | | |
|---|---|---|
| 17 | μf | 0.0024 |
| 63 | μf | 0.5 |
| 25 | μf | 0.016 |
| 77 | μμf | 10 |
| 28 | μf | 0.024 |
| 29 | μμf | 100 to 2000 |
| 52 | μf | 0.5 |
| 53 | μf | 0.5 |
| 83 | μf | 0.1 |

Various resistors employed had values as follows:

| | Ω |
|---|---|
| 38 | 6,200 |
| 75 | 680 |
| 69 | 2,200 |
| 44 | 1,500 |
| 46 | 1,500 |
| 48 | 1,600 |
| 79 | 47,000 |
| 81 | 100,000 |

The transformer 72 was of the push-pull to single-ended type, having 156 turns center-tapped on its primary and 156 turns on the secondary. Rectifier 78 was a No. 1N34A diode.

The amplifier constructed as above gave good stable operation, without tendency toward self-oscillation. The output was relatively free of undesired harmonics at any selected frequency within the range indicated.

What is claimed is:

1. An electronic network for amplification of radio frequencies comprising a pair of vacuum tubes having plate, cathode, and control grid elements, a pair of input leads connected to the control grids, an input transformer having a pair of secondary coils connected to apply exciting voltages to said leads, said secondary coils being insulated with respect to ground, electrostatic shielding disposed about each of said secondary coils and connected to one terminal of the same, the other terminal of each of said secondary coils being connected to the corresponding input lead, a pair of output leads, an output transformer having a pair of secondary coils connected to apply amplified radio frequency energy to the output leads, said transformer having a pair of primary windings, one terminal of each primary winding being connected to a source of plate voltage and the other terminal of each primary winding being connected to a corresponding tube plate, a pair of current supply transformers having secondary windings insulated with respect to ground and connected to supply heating current to the cathodes of the tubes, each of said last named windings being electrically connected to a corresponding output lead, and means for applying bias voltage to said control grids.

2. An electronic amplifier network as in claim 1 wherein the electrostatic shielding disposed about each of the said secondary coils and connected to one terminal of the same totally shields the said winding.

3. An electronic network for amplification of radio frequencies comprising a pair of vacuum tubes having plate, cathode, control grid and screen grid elements, a pair of input leads, oscillation suppression resistors connecting said leads to the control grids of the corresponding tubes, an input transformer having a pair of secondary coils connected to apply exciting voltages to said leads, a pair of output leads, an output transformer having a pair of secondary coils connected to apply amplified radio frequency energy to the output leads, said transformer having a pair of primary coils, one terminal of each primary coil being connected to a source of plate voltage and the other terminal of each primary coil being connected to a corresponding tube plate, a pair of current supply transformers having secondary windings insulated with respect to ground and connected to supply heating current to the cathodes of the tubes, each of said last named windings being connected to a corresponding output lead, means for applying negative bias voltage to the input leads, said means including an impedance equalizing resistor and a peaking inductance connected in series between a source of biasing voltage and the corresponding input lead, means for applying voltage to the screen grids, separate electrostatic shielding coupled to the cathode of each tube, said electrostatic shielding associated with each tube embracing the cathode and control grid of that tube and also said oscillation suppression resistor, said equalizing resistor and said peaking inductance associated with that tube, electrostatic shielding surrounding each secondary coil of the input transformer, one terminal of the corresponding secondary coil being electrically connected to such shielding, and electrostatic shielding surrounding said input lead and extending from the shielding about the corresponding secondary coil to the shielding coupled to the cathode of the corresponding tube.

4. An electronic amplifier network as in claim 3 wherein the electrostatic shielding disposed about each of the said secondary coils and connected to one terminal of the same totally shields the said winding.

5. An electronic network for amplification of radio frequencies comprising a pair of vacuum tubes having plate, cathode, control grid and screen grid elements, a pair of input leads, oscillation suppression resistors connecting said leads to the control grids of the corresponding tubes, an input transformer having a pair of secondary coils connected to apply exciting voltages to said leads, a pair of output leads, an output transformer having a pair of secondary coils connected to apply amplified radio frequency to the output leads, the adjacent terminals of said coils being connected to ground, said transformer having a pair of primary coils, the remote terminals of said primary coils being cross-connected to the plates of said tubes and the adjacent terminals being connected to a source of plate voltage, a pair of current supply transformers having secondary windings and insulated with respect to ground connected to supply heating currents to the cathodes of the tubes, each of said last named windings being connected to a corresponding output lead, means for applying negative bias voltage to the input leads, said means including an impedance equalizing resistor and a peaking inductance connected in series between a source of biasing voltage and the corresponding input lead, means for applying voltage to the screen grids, electrostatic shielding embracing the cathode and control grid of each tube and also said coupling resistor and said equalizing resistor and said peaking inductance for each tube and coupled to the cathode of the corresponding tube, electrostatic shielding disposed about each of said secondary coils and connected to one terminal of the same to totally shield the said coil, and electrostatic shielding surrounding said input leads and extending from the shielding about the corresponding secondary coil to the first named shielding.

6. An electronic network for amplification of radio frequencies comprising a pair of vacuum tubes having plate, cathode, and control grid elements, a pair of input leads connected to the control grids, an input transformer having a pair of secondary coils connected to apply exciting voltages to said leads, said secondary coils being insulated with respect to ground, electrostatic shielding disposed about each of said secondary coils and connected to one terminal of the same, the other terminal of each of said secondary coils being connected to the corresponding input lead, means coupling said electrostatic shielding disposed about each secondary coil to the cathode of the tube with which that secondary coil is associated, a pair of output leads, an output transformer having a pair of secondary coils connected to apply amplified radio frequency energy to the output leads, said transformer having a pair of primary windings, one terminal of each primary winding being connected to a source of plate voltage and the other terminal of each primary winding being connected to a corresponding tube plate, means electrically connecting each of said cathodes to a respective one of said output leads energized by a signal having the same phase as the signal at that cathode, and means for applying bias voltage to said control grids.

7. An electronic amplifier network as in claim 6 wherein the electrostatic shielding disposed about each of the said secondary coils and connected to one terminal of the same totally shields the said winding.

8. An electronic network for amplification of radio frequencies comprising a pair of vacuum tubes having plate, cathode, control grid and screen grid elements, a pair of input leads, oscillation suppression resistors connecting said leads to the control grids of the corresponding tubes, an input transformer having a pair of secondary coils connected to apply exciting voltages to said leads, a pair of output leads, an output transformer having a pair of secondary coils connected to apply amplified radio frequency energy to the output leads, said transformer having a pair of primary coils, one terminal of each primary coil being connected to a source of plate voltage and the other terminal of each primary coil being connected to a corresponding tube plate, means electrically connecting each of said cathodes to a respective one of said output leads energized by a signal having the same phase as the signal at that cathode, means for applying negative bias voltage to the input leads, said means including an impedance equalizing resistor and a peaking inductance connected in series between a source of biasing voltage and the corresponding input lead, means for applying voltage to the screen grids, separate electrostatic shielding coupled to the cathode of each tube, said electrostatic shielding associated with each tube embracing the cathode and control grid of that tube and also said oscillation suppression resistor, said equalizing resistor and said peaking inductance associated with that tube, electrostatic shielding surrounding each secondary coil of the input transformer, one terminal of the corresponding secondary coil being electrically connected to such shielding, and electrostatic shielding surrounding said input lead and extending from the shielding about the corresponding secondary coil to the second named shielding.

9. An electronic amplifier network as in claim 8 wherein the electrostatic shielding disposed about each of the said secondary coils and connected to one terminal of the same totally shields the said winding.

10. An electronic network for amplification of radio frequencies comprising a pair of vacuum tubes having plate, cathode, control grid and screen grid elements, a pair of input leads, oscillation suppression resistors connecting said leads to the control grids of the corresponding tubes, an input transformer having a pair of secondary coils connected to apply exciting voltages to said leads, a pair of output leads, an output transformer having a pair of secondary coils connected to apply amplified radio frequency to the output leads, the adjacent terminals of said coils being connected to ground, said transformer having a pair of primary coils, the remote terminals of said primary coils being cross-connected to the plates of said tubes and the adjacent terminals being connected to a source of plate voltage, means electrically connecting each of said cathodes to a respective one of said output leads energized by a signal having the same phase as the signal at that cathode, means for applying negative bias voltage to the input leads, said means including an impedance equalizing resistor and a peaking inductance connected in series between a source of biasing voltage and the corresponding input lead, means for applying voltage to the screen grids, electrostatic shielding embracing the cathode and control grid of each tube and also said coupling resistor and said equalizing resistor and said peaking inductance for each tube and coupled to the cathode of the corresponding tube, electrostatic shielding disposed about each of said secondary coils and connected to one terminal of the same to totally shield the said coil, and electrostatic shielding surrounding said input leads and extending from the shielding about the corresponding secondary coil to the first named shielding.

References Cited in the file of this patent

UNITED STATES PATENTS 1,948,303 Lavoie ---------------- Feb. 20, 1934

FOREIGN PATENTS 171,670 Austria ---------------- June 25, 1952
759,710 Germany --------------- Feb. 16, 1953